United States Patent [19]

Goldfarb

[11] Patent Number: 4,654,472

[45] Date of Patent: Mar. 31, 1987

[54] ELECTRONIC COMPONENT PACKAGE WITH MULTICONDUCTIVE BASE FORMS FOR MULTICHANNEL MOUNTING

[76] Inventor: Samuel Goldfarb, 21 Sycamore Dr., Roslyn, County of Nassau, N.Y. 11576

[21] Appl. No.: 682,558

[22] Filed: Dec. 17, 1984

[51] Int. Cl.⁴ .............................................. H05K 5/00
[52] U.S. Cl. ............................ 174/52 R; 339/176 M
[58] Field of Search ............. 174/50.52, 50.54, 52 R, 174/52 H, 52 S, 94 R, 16 HS; 339/17 CF, 176 M, 184 M, 185 R, 186 M, 275 R, 275 B; 361/386, 401, 405; 165/185, 78, 80 B

[56] References Cited

U.S. PATENT DOCUMENTS

| | | | |
|---|---|---|---|
| 3,082,350 | 3/1963 | Golbrandser | 174/50.52 X |
| 3,148,356 | 9/1964 | Hedden, Jr. | 339/17 CF X |
| 3,429,980 | 2/1969 | Gottmann | 174/52 S |
| 4,095,253 | 6/1978 | Yoshimura et al. | 174/16 HS X |
| 4,109,295 | 8/1978 | Rostek et al. | 361/401 |
| 4,109,296 | 8/1978 | Rostek et al. | 361/401 |
| 4,316,320 | 2/1982 | Nogawa et al. | |
| 4,368,503 | 1/1983 | Kurosawa et al. | |
| 4,420,652 | 12/1983 | Ikeno | 174/52 H |
| 4,525,769 | 6/1985 | Lehmann | 361/386 |

Primary Examiner—A. T. Grimley
Assistant Examiner—D. A. Tone
Attorney, Agent, or Firm—Seymour Levine

[57] ABSTRACT

An improved electronic component or integrated circuit (IC) package characterized by an extraordinary small size for the number of input-output (I/O) leads which are available and capable of use on surface mounted, Flat Pack, hybrid, or through hole (DIP) printed circuit boards. The package has one or more cylindrical or shaped forms at the base, with a flange to provide a stop in order to limit the insertion travel in those circuit boards having through holes, and a top body which is used to house the electronic device. The forms, which protrude down from the upper body (housing), have one or more conductive lead segments, either pins or printed circuit types, running longitudinally and continuing through the housing to the upper body.

Each lead segment is connected directly to the electronic device or attached via an additonal lead to a pad on the electronic device, mounted on the upper body. A cover to seal the device is provided. Grooves in the body or on the cover aid in handling the device, either manually or by automatic machinery, are provided. These grooves also provide gripping areas for top hat heat sinks.

15 Claims, 12 Drawing Figures

ELECTRONIC COMPONENT PACKAGE WITH MULTICONDUCTIVE BASE FORMS FOR MULTICHANNEL MOUNTING

BACKGROUND OF THE INVENTION

For years, electronic packaging has centered around Dual Inline Packaging (DIP) and Flat Pack component construction techniques, with discrete components, hybrids, or special packages using cans or potted molds meeting various packaging requirements. These devices were mounted on printed circuit (PC) boards, which served to electrically interconnect the circuitry to perform various electronic functions.

On PC boards, DIP components may be wired by placing component leads, or component carrier leads through holes in the PC board and flow soldering the board using automatic machinary. This type of construction is often preferred over Flat Pack techniques because Flat Packs lay on the board and can not easily be wavesoldered. Automatic bonding of Flat Packs to PC boards, however, may be realized with induction heaters and hot vapor heating techniques. In addition DIP construction is preferred because Flat Packs have leads that extend outward from the body and require more PC board real estate than DIP components. The more components and circuits that can be placed on a single board, the fewer boards required for an electronic device, and the less expensive the device. Applications for both types of packages still exist and component manufacturers make components in both Flat Pack and DIP configurations.

More recently, a newer technique called Surface Mounted Technology (SMT) has evolved. Components for this technology are usually very small and have solderable pads instead of leads. These components mount on the boards with off shoots of the solderable pads overlapping pads on the PC board and are soldered to the PC board with solder paste, or with the soldering technology developed for Flat Pack attachment. Automatic construction techniques have been conceived for each of the above processes, wherein individual components are mounted on rolls or in stacks and dropped into position on the boards for permanent soldering. These automatic constructions also pretin the leads, apply solder or solder paste, reflow solder, wave solder, hot fluid solder, apply flux, clean the boards, etc.

As PC boards became more sophisticated, with more conductive layers and ground planes, methods of through hole plating to electrically interconnect various layers of the boards, and to join leads coming through the boards, were developed. U.S. Pat. No. 4,322,778 issued to Barbour et. at. entitled "High Performance Semiconductor Package Assembly" describes a semiconductor package with a plurality of integrated circuit devices having a multilayer substrate. U.S. Pat. No. 4,368,503 issued to Kurosawa et. al. and U.S. Pat. No. 4,389,278 issued to Kai describe different methods of interjoining multilayers and fabricating such boards. U.S. Pat. Nos. 4,109,295 and 4,109,296 both issued to Rostek, et. al. describe a circuit board component which is mounted by inserting the component into a hole in the circuit board. This component has one or more conductive sectors around its periphery to attach, either by solderable or gas tight means, to a similar number of conductive sectors about the hole wherein the component is inserted for mounting on the board.

It is evident that a most desirable electronic circuit package is one that is easily manufactured at low cost with automatic equipment, is configured for reel, roll or stack mounting in automatic machinary, is easily held and easily keyed for accurate positioning on PC boards, has accessible leads, is not easily bent or misconfigured, and is mountable in either through hole DIP, Flat Pack or SMT boards.

It is further evident that this desirable component configuration should require minimum PC board real estate and a minimum number of drilled holes for a DIP board construction (since drilling holes is time consuming and costly).

It is further evident that this desirable package lends itself to sizing in various compatible dimensions for different types of component and/or chips, for operation over a broad range of signal and power levels, and to standardization in a family of components to permit close mounting and the sharing of heat removal devices.

It is further evident that this desirable component configuration offers "hybrid" features to share DIP, Flat Pack, or SMT leads.

It is further evident that this desirable package unites many conductive leads in a single form to make a rigid structure, thereby providing greater lead integrity than packages with fine conductive leads projecting from a chip housing.

SUMMARY OF THE INVENTION

In accordance with the principles of the present invention an electrical component assembly includes a housing having an upper body integral with, one or more lower projecting forms, and a cover. An "active" component or chip located in a hollow region of the upper body may have output pads or leads attachable to conductive segments on the lower projecting forms. These conductive segments lie on the outer periphery of each form and may be oriented parallel to the axis of the form, extend through the lower wall of the upper housing and into the hollow region of the upper body where the conductive segments are electrically coupled to the output pads or leads on the component or chip. After the pads on the components (there may be more than one) are coupled to the conductive segments, the cover is attached using conventional hermetic or plastic sealing techniques.

In one preferred embodiment of the invention, the projecting forms have a flange attachment to the lower wall of the upper housing. The flange serves as a spacer for the component assembly when it is inserted into a board having a through hole or DIP configuration. The cover, or the upper body, may have lateral external grooves for easy gripping and for attaching shields or heat sinks. In addition, the cover may have indentations in the location and position of the lower projecting forms. These indentations facilitate stacking component assemblies one within the other for use by automated equipment.

In another preferred embodiment of the invention, the component is a chip, having 14 pads, such as that used in 14 pin DIP or Flat Pack configurations. In this embodiment, two cylindrical forms, each with seven segmented pins oriented parallel to the axis of the form, extend past the flange on the lower base, through the base into the hollow region of the body to form around the periphery of the chip. This embodiment, when used on a PC card, permits component placement on the board in such close proximity that the clearance there-between is indiscernible. Such close positioning may be realized because the component assembly can be surface mounted on the board through pads on the bottom of the component assembly, or it can be placed in counter bored holes in the board for precision alignment before it is soldered to pads on the top surface of the board on the periphery of the bore, or it can be placed in through holes in a board which have pads on the lower surface about the periphery of the hole adjacent to the pins positioned on the cylindrical form parallel to the cylindrical axis. When used this way, the component assembly may be wave soldered to the board, and because the connections are below the component, with close proximity to adjacent components.

In still another embodiment of the invention, only one cylindrical form projects from the base. In this configuration fewer inside components are used, therefore fewer leads are encountered, permitting several leads to be larger than the others, thereby providing increased current capacity.

In yet still another embodiment of the invention, many cylindrical forms may project from the base, each having the capability of holding different sized and shaped conductors. Forms in this embodiment may contain solid or hollow conductive pins.

DESCRIPTION OF THE PREFERRED EMBODIMENTS

Figure 1A:
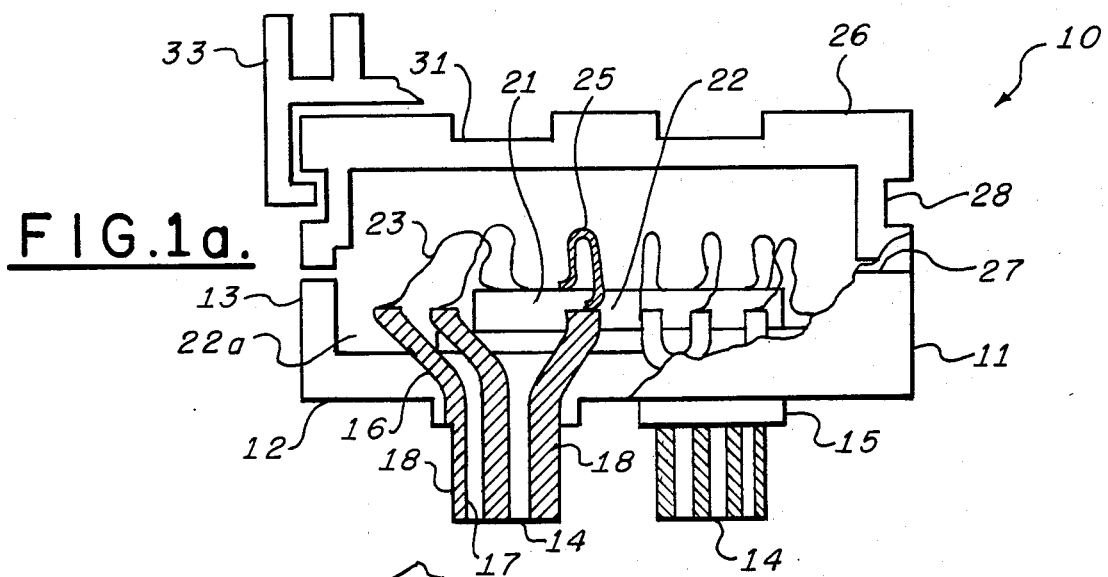
FIG. 1a is a pictoral view, partially in cross section of a preferred embodiment of the invention.
Figure 1B:
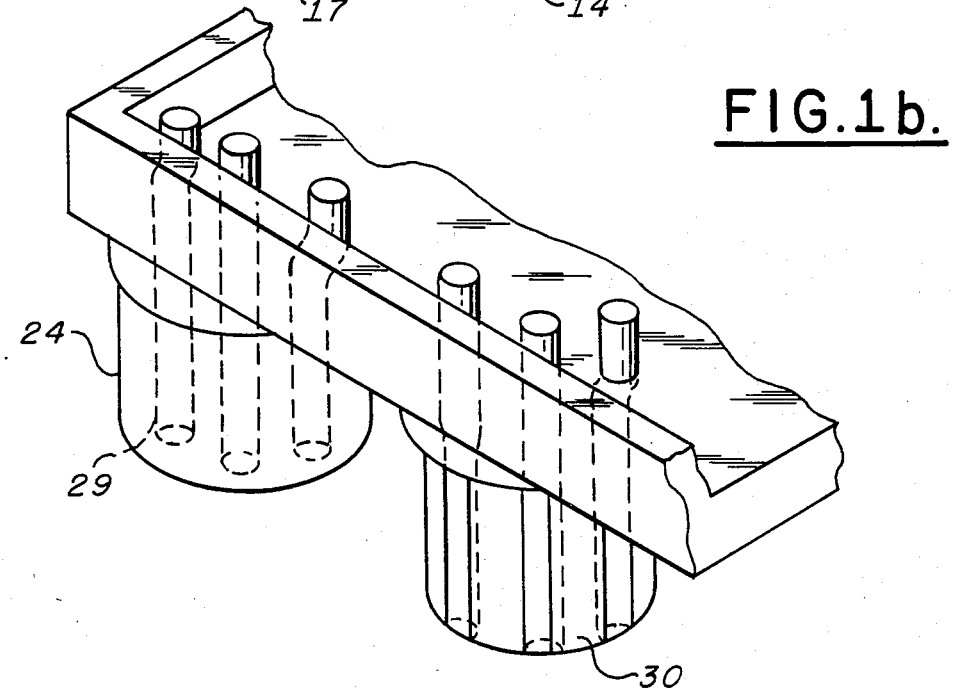
FIG. 1b is a partial isometric view showing an oversized cylindircal form with pins inserted in holes bored therein and an adjacent cylindrical form machined to a desired diameter.

Referring to FIG. 1a, a circuit board component housing 10 is shown comprising an upper body 11 having a base 12 and side walls 13. The package 10 may be made of a non-conductive material such as plastic or ceramic. Two forms 14 affixed to, or formed as an integral part of, the body are positioned below the base 12, of the body. These forms may be cylindrical (circular, rectangular, triangular) or of another suitable geometric shape, including conical. A flange member 15 may be affixed to, or formed around, each cylindrical form as a spacer. Holes 16 are bored through the base 12 and flange 15. Channels 17, aligned with the holes 16, are formed on the outside of the forms parallel to the cylindrical axis. Conductive leads 18 are inserted or molded in the holes 16 and extend in the channels 17 to the bottom of the form, being insulated from one another by the form and housing material. The conductive leads 18 may be preshaped to form a smooth periphery with the plastic body of the form. Alternatively, as illustrated in FIG. 1b, the cylindrical form may be initially of a larger diameter than desired with holes 29 bored parallel to the cylindrical axis near the periphery and the conductive leads adhered or molded in place, before machining the composite structure. After machining to the desired diameter, the conductive leads are exposed as axial segments of each final cylindrical form, such as in form 30.

Refer again to FIG. 1a, the component or chip 21 may be placed on a mounting block 22 and coupled to the appropriate lead, which may be flex, printed or PC attached, either directly or via wires 23, 25 which may be soldered, solder pasted or welded in place.

Figure 1C:
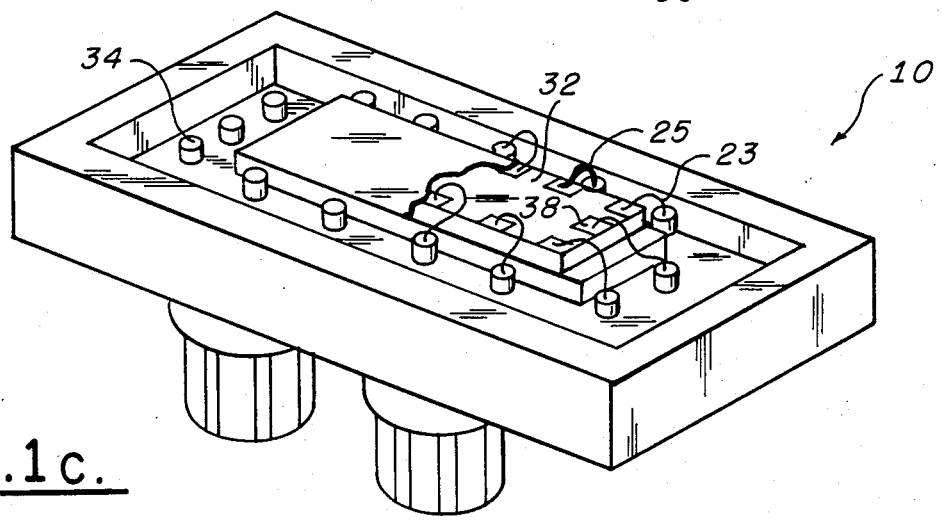
FIG. 1c is an isometric view of the preferred embodiment of FIG. 1a illustrating the position of the chip and attachment leads.

A cover 26 may be hermetically or plastic sealed along the periphery 27 and may contain grooves 28 for gripping the device, and indents 31 for stacking the device. Heat sinks 33 may be placed in the gripping grooves to remove heat when the power dissipation of the device so requires. A view of the component with the cover removed is shown in FIG. 1c wherein elements previously referenced bear the same reference numerals. Pads 38 on the chip 32 are joined by wires 23, 25 to the conductors 34. As shown in this configuration, the wire 23 is finer than wire 25 to provide greater current capacity for wire 25.

Figure 1D:
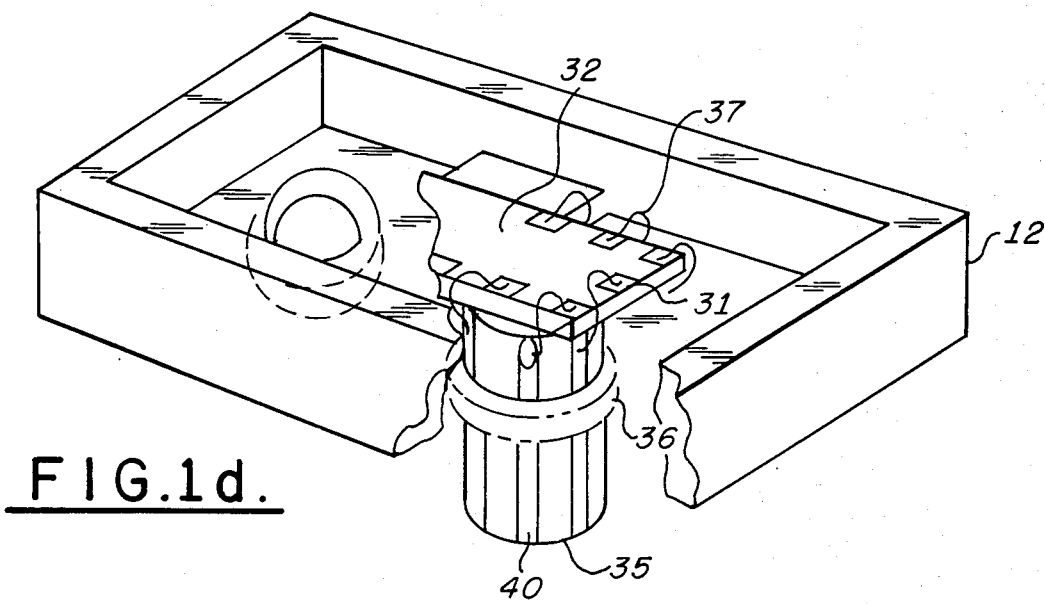
FIG. 1d is an isometric view showing the position and attachment to a board of a chip in a cylindrical form with printed circuit leads.

Refer now to FIG. 1d, wherein a premanufactured cylindrical form 35 is shown inserted in the base 12 which has a premolded flange 36. Once the forms are positioned at the proper height in the base 12 and the assembly unitized via molding, pressing or adhering, wires 37 are attached to the pads 31 of the chip 32 to the conductive segments 40 of the form 35.

Figure 1E:
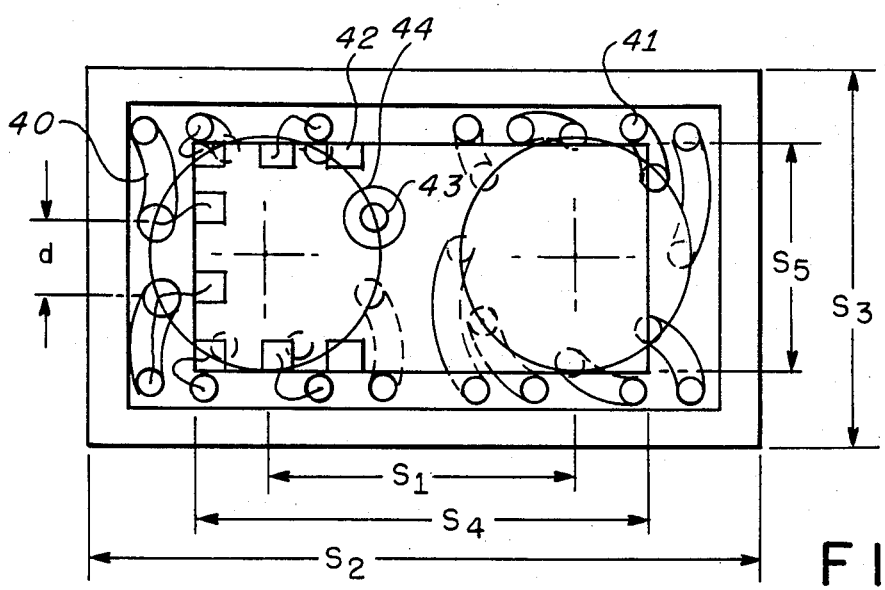
FIGS. 1e and 1f are drawings of a preferred embodiment with dimensions indicated thereon.

FIG. 1e shows the possible size of a two form, 16 conductor, device manufactured in accordance with this invention. Forms 35 are approximately 0.110 inches in diameter, spacing d of the leads 40 shown on each form is approximately 0.043 inches pitch. This device would be capable of carrying a 0.16 in.×0.21 in. sized component chip. The spacing $s_1$ between centers of the cylindrical forms is approximately 0.175 inches, the total length $S_2$ of the component is 0.36 in. while its total width $s_3$ is 0.26 in. Further, the length $s_4$ of the mounting block is 0.21 inches and its width $s_5$ is 0.16 inches. Pins 43, protruding from the upper body, may be positioned through holes bored in the chip and substrate to couple to pads 44 on the substrate for grounding or signal feedthrough purposes.

Figure 1F:
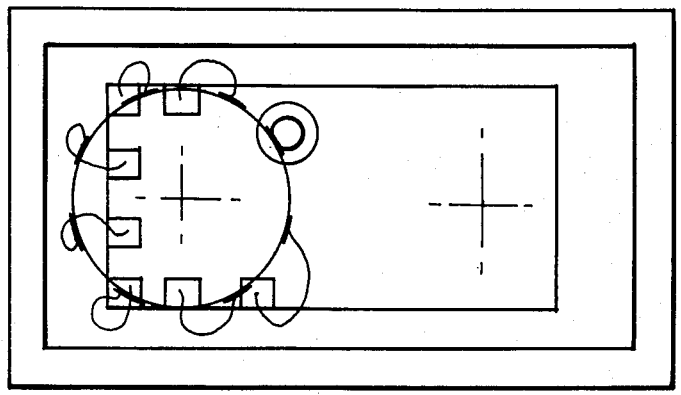

A PC board configuration corresponding to FIG. 1e, and of similar size, is shown in FIG. 1f.

Figure 2A:
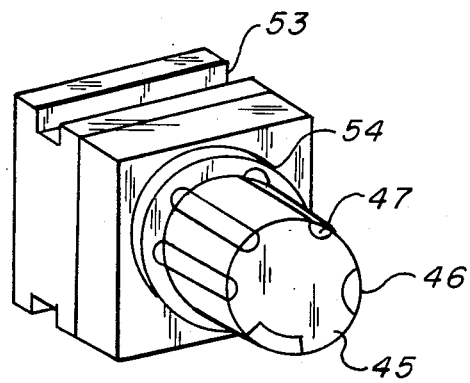
FIGS. 2a through 2c are isometric views depicting three embodiments of the invention.
Figure 2B:
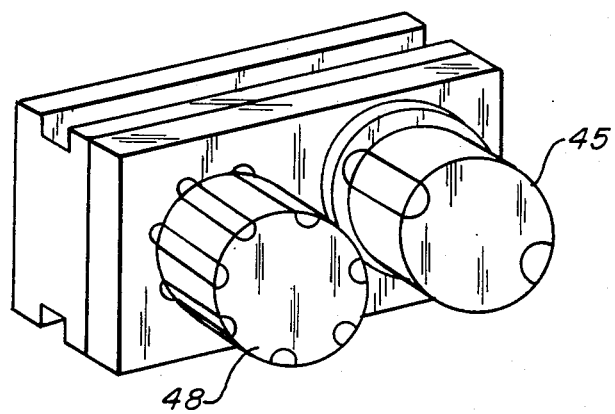
Figure 2C:
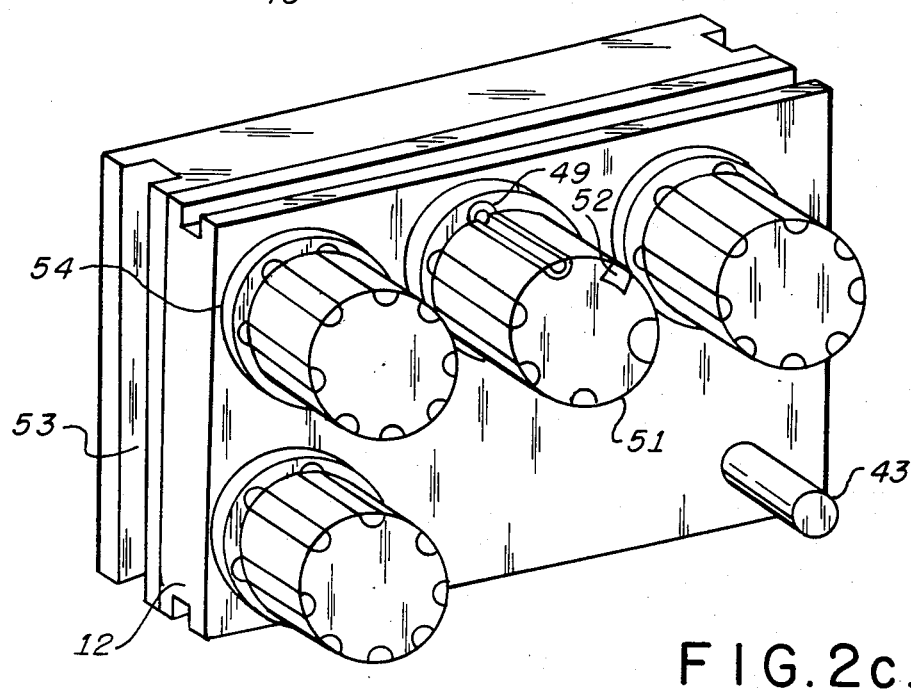

Embodiments of the invention that provide devices with different number of cylindrical forms 45 having conductors 46, 47 of different sizes and positions on the forms 45 are shown in FIGS. 2a, 2b and 2c. The diameter of the cylindrical form may vary. It may be of a diameter represented by the form 45 or the diameter represented by the form 48. Where two or more forms are on a single-device, they may be of different diameters. A multiplicity of shapes are also possible. For example the form 51 is shaped to have superior retentive properties with the inclusion of a key 52. A flange 54 is not essential, the forms being mountable without a flange, as for example form 48. Further, the body 12 may have gripping grooves such as the grooves 53 in addition to or in lieu of the gripping grooves 28 in the cover 26 (FIG. 1a). To facilitate component grounding, the pin 43 may be connected to all the component ground terminals and connect to a grounding pad as previously described.

A hollow segment 49 may be employed on a form to provide a cup which facilitates soldering and offers greater area for superior wicking capability, enabling a pin to be formed in the upper body 11 (FIG. 1a) before attachment to the fine conductive wire of an "active" component.

Figure 3A:
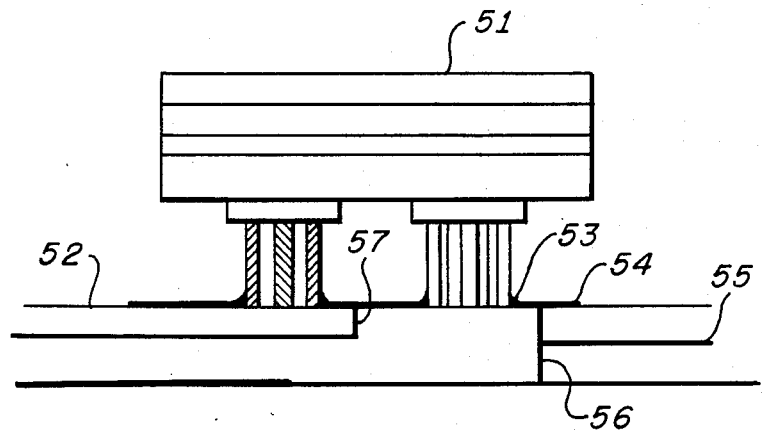
FIGS. 3a through 3c are illustrations of methods for mounting the invention on PC boards.
Figure 3B:
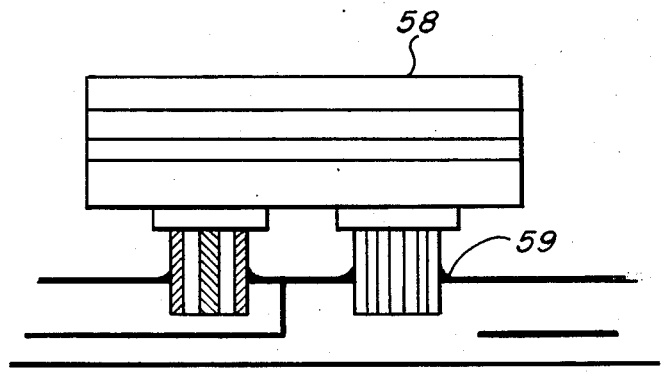
Figure 3C:
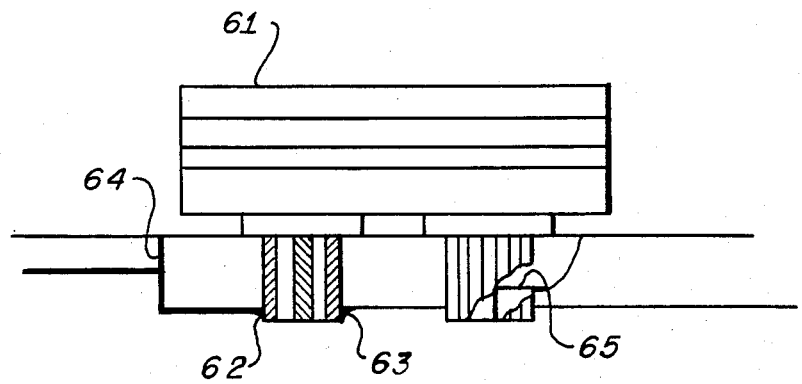

Referring now to FIG. 3a a preferred embodiment of the invention 51, may be surface mounted on a PC board 52 by soldering 53 to pads 54 provided on the PC board 52 for each active chip lead. Pad 54 may couple to a midplane circuit 55 via a vertical riser 56 or via a segment riser 57. In FIG. 3b the embodiment 58 is shown positioned in counter bored holes 59 which mechanically support and position the device 58. In FIG. 3c, the device 61 is mounted in through holes 62 and soldered 63 to pads at the bottom of the board. The pads may be an extension of a vertical riser 64 or a segmented riser 65 in the hole.

While the invention has been described in its preferred embodiments, it is to be understood that the words which have been used are words of description rather than limitation and that changes may be made within the purview of the appended claims without departing from the true scope and spirit of the invention in its broader aspects.

I claim:

1. A housing for coupling electronic circuits inserted therein to a printed circuit board comprising:
    an upper body having a component region for locating said electronic circuits; and
    at least one form protruding from said upper body, at least one of which is a cylinder having a cylinder axis, said at least one form constructed for insertion into mating areas on one surface of said printed circuit board, each of said at least one form having an outer periphery with one or more electrical conductive segments on said outer periphery, said electrical conductive segments extending into said component region for coupling said electronic circuits to said one surface of said printed circuit board.

2. A housing in accordance with claim 1 wherein at least one of said one or more electrical conductive segments is positioned to be parallel with said cylinder axis.

3. A housing in accordance with claim 2 wherein at least one of said electrical conductive segments has dimensions that differ from dimensions of other of said electrical conductive segments.

4. A housing in accordance with claim 1 further including a cover, positionable on and hermetically sealable with said upper body.

5. A housing in accordance with claim 4 wherein said cover includes gripping grooves.

6. A housing in accordance with claim 5 further including heat sinks positioned in said gripping grooves.

7. A housing in accordance with claim 6 wherein said upper body contains gripping grooves.

8. A housing in accordance with claim 4 wherein said upper body, said cover, and said at least one form are constructed of non-conductive material.

9. A housing in accordance with claim 1 wherein each of said at least one form contains a flange adjacent said upper body.

10. A housing in accordance with claim 1 wherein said at least one form comprises at least two forms, said at least two forms being circular cylinders and at least one of said at least two forms is of a diameter that differs from diameters of other of said at least two forms.

11. A housing in accordance with claim 10 further including a grounding pin having a circular cylinder geometric configuration and extending through said upper body into said component region for grounding said electronic circuits.

12. A housing in accordance with claim 1 wherein at least one of said at least one form contains a keying segment.

13. A housing in accordance with claim 1 wherein at least one of said at least one form contains a hollow segment.

14. A housing in accordance with claim 13 wherein said hollow segment is filled with solder, thereby forming a conductive segment.

15. A housing in accordance with claim 1 wherein:
    said upper body and said at least one form are constructed of nonconductive material;
    said upper body possesses a base having holes bored therethrough;
    said electrical conductive segments comprise conductive material continuously extending through said holes and along channels formed in said at least one form and aligned with said holes; and further includes
    a block, for mounting said electronic circuits, positioned in said component region.

* * * * *